United States Patent
Chin et al.

(10) Patent No.: US 10,483,396 B1
(45) Date of Patent: Nov. 19, 2019

(54) INTERFACIAL LAYER BETWEEN FIN AND SOURCE/DRAIN REGION

(71) Applicant: Taiwan Semiconductor Manufacturing Company, Ltd., Hsinchu (TW)

(72) Inventors: Chih-Yun Chin, Taichung (TW); Chii-Horng Li, Zhubei (TW); Chien-Wei Lee, Kaohsiung (TW); Hsueh-Chang Sung, Zhubei (TW); Heng-Wen Ting, Pingtung County (TW); Roger Tai, Tainan (TW); Pei-Ren Jeng, Chu-Bei (TW); Tzu-Hsiang Hsu, Xinfeng Township (TW); Yen-Ru Lee, Hsinchu (TW); Yan-Ting Lin, Baoshan Township (TW); Davie Liu, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/004,677

(22) Filed: Jun. 11, 2018

(51) Int. Cl.
*H01L 29/78* (2006.01)
*H01L 29/66* (2006.01)
*H01L 29/165* (2006.01)
*H01L 29/08* (2006.01)
*H01L 21/762* (2006.01)
*H01L 21/8234* (2006.01)

(52) U.S. Cl.
CPC .......... *H01L 29/785* (2013.01); *H01L 21/762* (2013.01); *H01L 21/823431* (2013.01); *H01L 29/0847* (2013.01); *H01L 29/165* (2013.01); *H01L 29/6681* (2013.01); *H01L 29/66803* (2013.01)

(58) Field of Classification Search
CPC .................................................... H01L 29/785
See application file for complete search history.

(56) References Cited

U.S. PATENT DOCUMENTS

2013/0264639 A1* 10/2013 Glass ................ H01L 21/28512
257/335

* cited by examiner

*Primary Examiner* — William A Harriston
(74) *Attorney, Agent, or Firm* — Slater Matsil, LLP

(57) ABSTRACT

An embodiment is a semiconductor structure. The semiconductor structure includes a substrate. A fin is on the substrate. The fin includes silicon germanium. An interfacial layer is over the fin. The interfacial layer has a thickness in a range from greater than 0 nm to about 4 nm. A source/drain region is over the interfacial layer. The source/drain region includes silicon germanium.

20 Claims, 11 Drawing Sheets

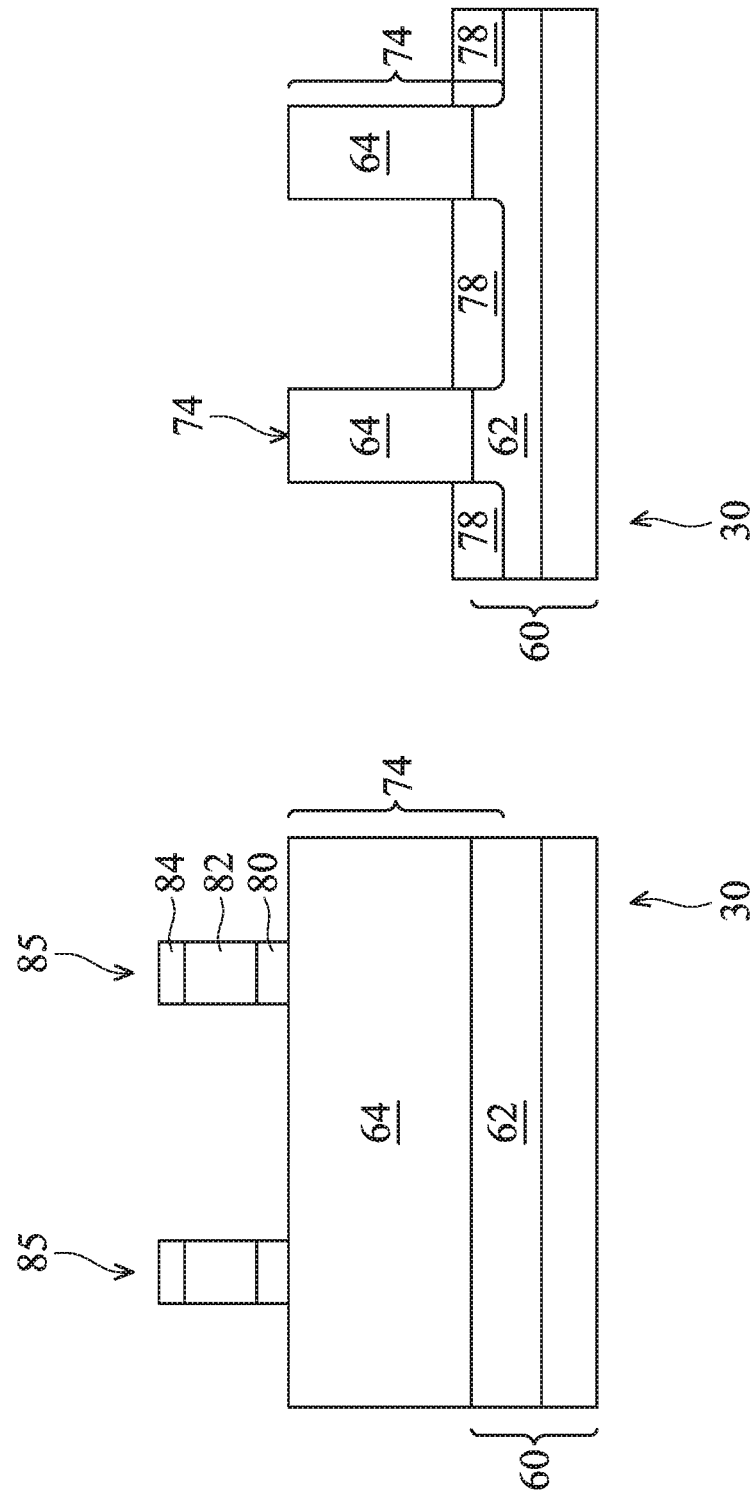

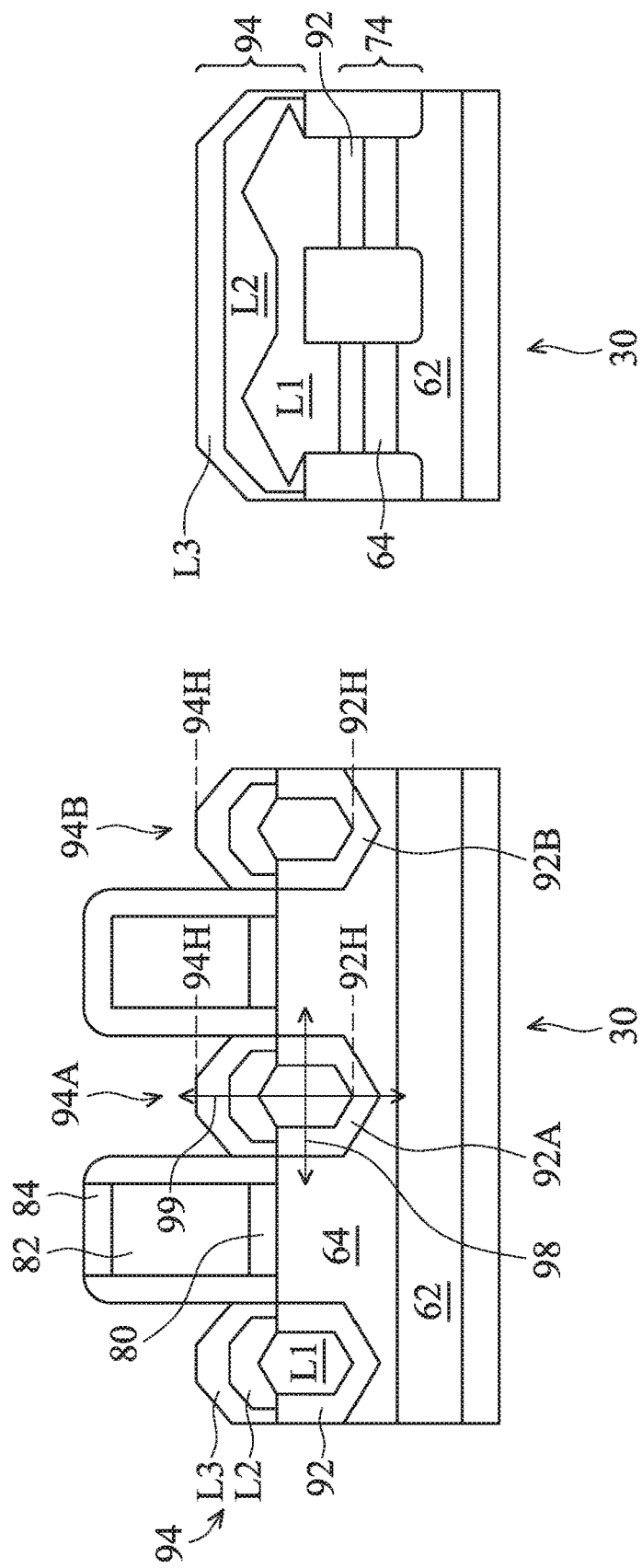

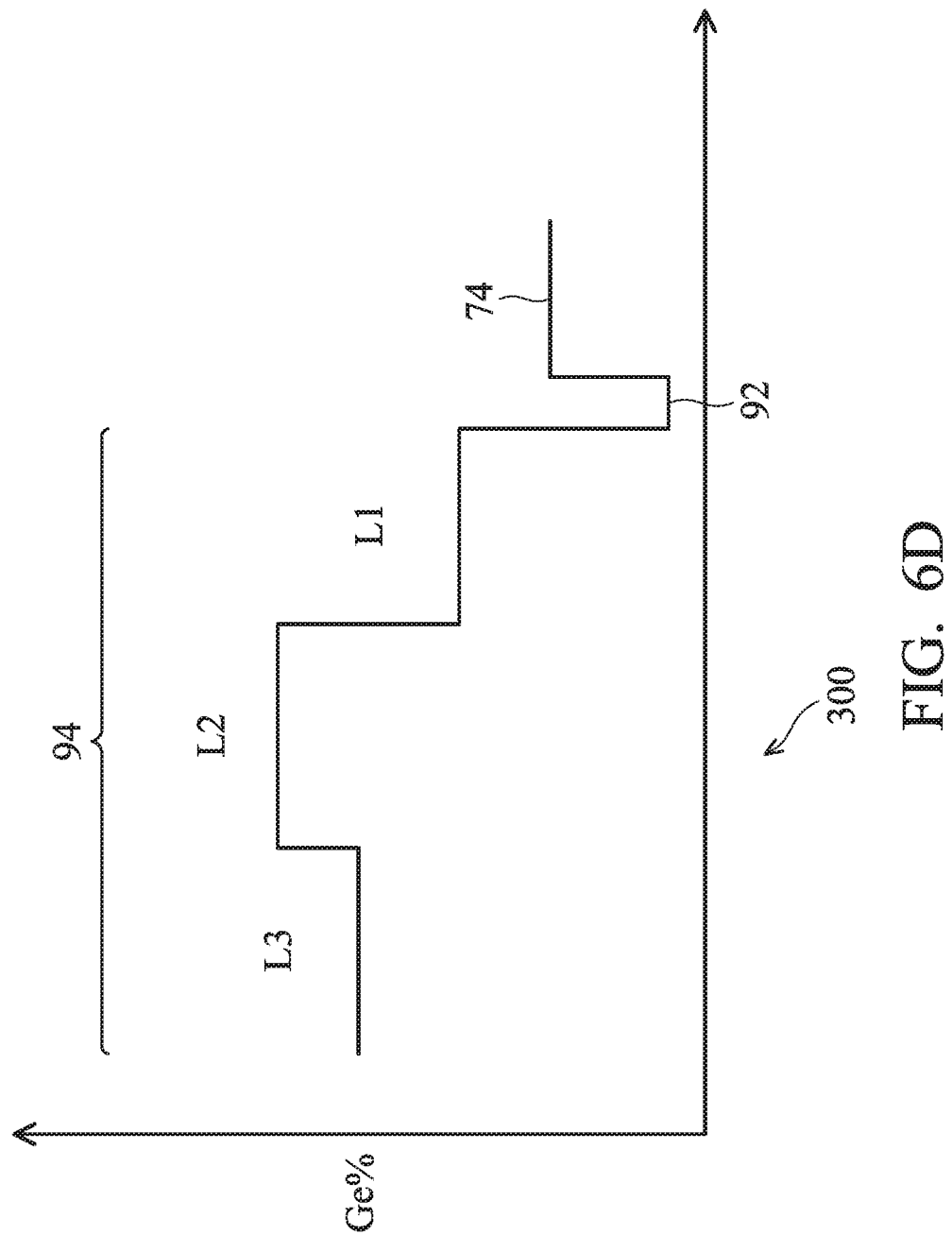

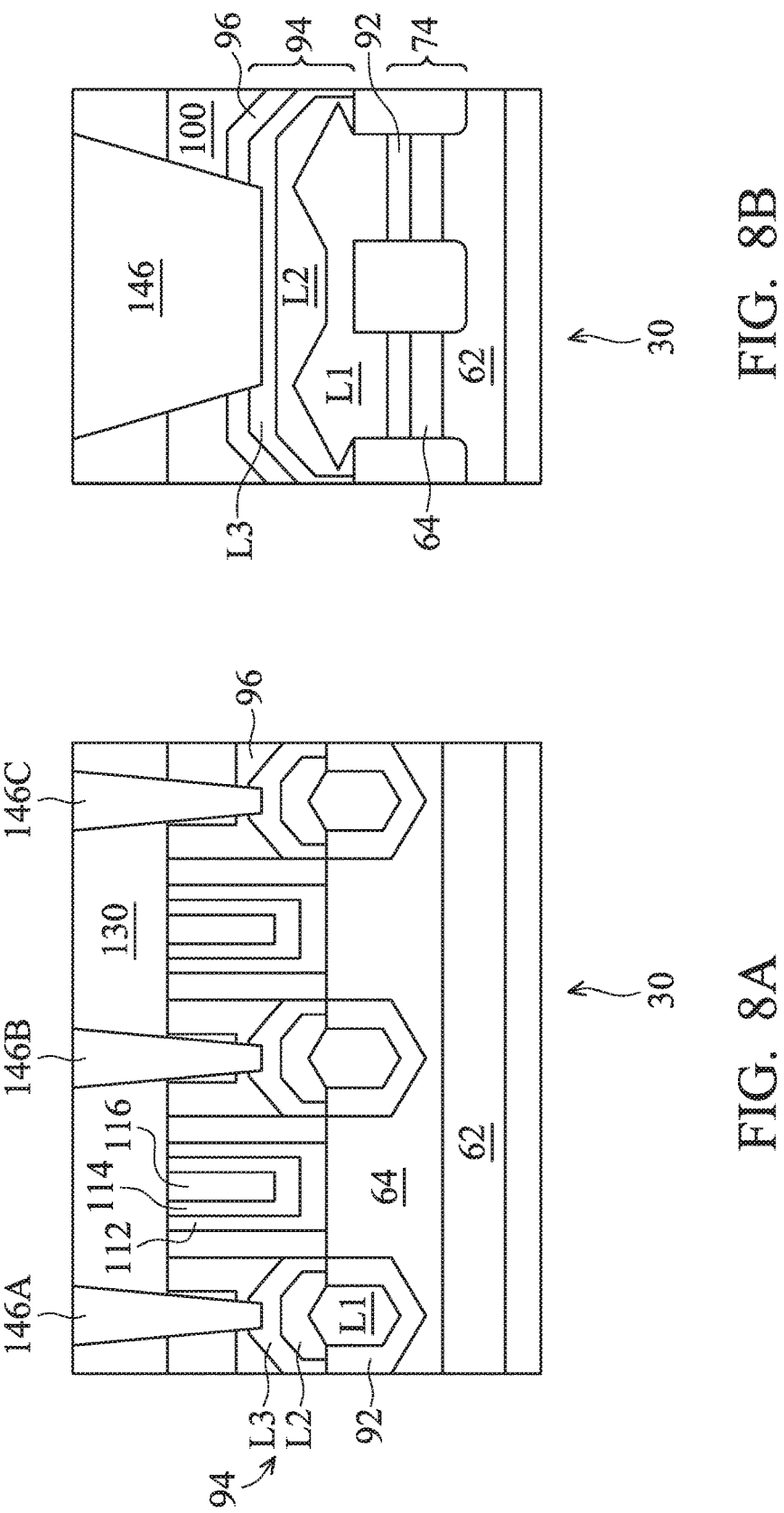

US 10,483,396 B1

INTERFACIAL LAYER BETWEEN FIN AND SOURCE/DRAIN REGION

BACKGROUND

As the semiconductor industry has progressed into nanometer technology process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices. However, with the decreasing in scale, new challenges are presented.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2B, 3A-3C, 4A-4B, 5A-5B, 6A-6B, 7A-7B, and 8A-8B illustrate various views of respective intermediate structures of a semiconductor device at intermediate stages of manufacturing the semiconductor device, in accordance with some embodiments.

FIGS. 6C-6D are graphs of the atomic percent content of germanium of a fin, an interfacial layer, and a source/drain region, in accordance with some embodiments.

DETAILED DESCRIPTION

Figure 1:
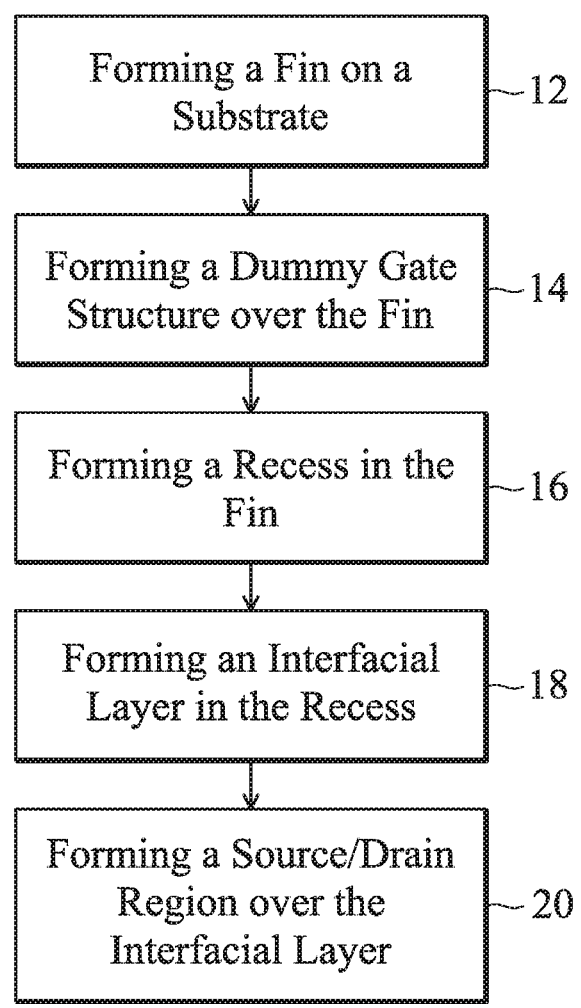
FIG. 1 is a flow diagram illustrating a method of manufacturing a semiconductor device, such as a FinFET structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments disclosed herein relate generally to forming an interfacial layer between an epitaxial source/drain region and a fin of a FinFET device. For example, the fin may have a recess formed therein, and the interfacial layer may be formed along surfaces of the recess before the epitaxial source/drain region is formed on the interfacial layer. In certain embodiments, the interfacial layer may suppress the effects of surface impurities formed during the manufacturing stages of a FinFET device. In certain embodiments, the interfacial layer may enhance uniform growth of the epitaxial source/drain region in the recess of a fin of a FinFET device.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The foregoing broadly outlines some aspects of embodiments described herein. Some embodiments described herein are described in the context of Fin Field Effect Transistors (FinFETs). Some embodiments are described herein in the context of a replacement gate process. Implementations of some aspects may be used in other processes and/or in other devices. For example, other example processes can include a gate-first process, and other example devices include Horizontal Gate All Around (HGAA) FETs, Vertical Gate All Around (VGAA) FETs, nanowire channel FETs, and other devices. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein.

FIG. 1 is a flow diagram illustrating a method 10 of manufacturing a semiconductor device, such as a FinFET structure, in accordance with some embodiments. The method 10 is described in reference to FIGS. 2A-B to FIGS. 8A-B. FIGS. 2A-B through 8A-B are cross-sectional views and a perspective view of respective intermediate semiconductor structures 30 at intermediate stages in an example process of forming a semiconductor device in accordance with some embodiments.

Figure 2A:
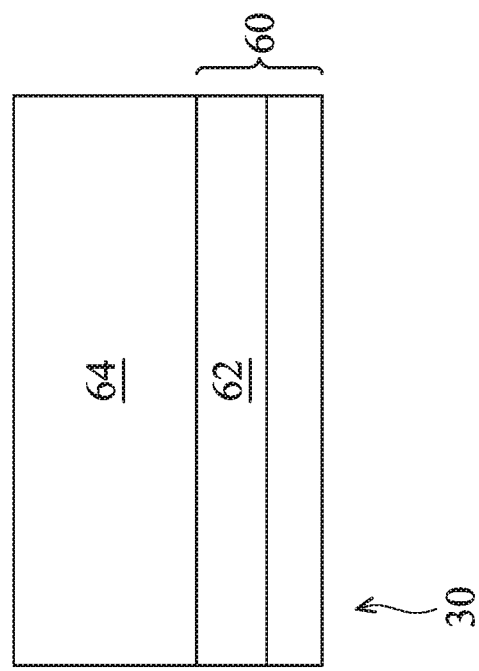
Figure 2B:
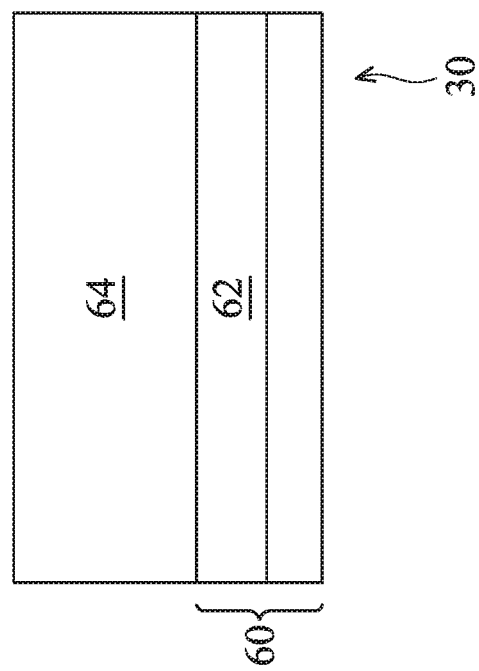

FIGS. 2A and 2B illustrate a semiconductor substrate 60, in accordance with some embodiments. The semiconductor substrate 60 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate 60 may include an elemental semiconductor including silicon (Si) or germanium (Ge); a compound semiconductor; an alloy semiconductor; or a combination thereof.

In the embodiments shown in FIGS. 2A and 2B, the semiconductor substrate 60 may be a silicon wafer having an area implanted or doped with an n-type dopant to form an n-well 62. Other areas of the semiconductor substrate 60 may have other areas implanted or doped with a p-type dopant to form a p-well (not shown). In certain embodiments, a p-type FinFET device or a p-type metal-oxide semiconductor device (PMOS) is formed over the n-well 62. A concentration of the n-type dopant in the n-well 62 can be in a range from about $5 \times 10^{16}$ cm$^{-3}$ to about $1 \times 10^{19}$ cm$^{-3}$. In certain embodiments, an epitaxial layer 64 may be deposited by epitaxial growth over the n-well 62. In certain embodiments, the epitaxial layer 64 is a SiGe ($Si_xGe_{1-x}$) layer having a germanium atomic percent content in a range from about 5% to about 40%. In other embodiments, the epitaxial layer 64 is a SiGe ($Si_xGe_{1-x}$) layer having a germanium atomic percent content in a range from about 40% to about 80%. The epitaxial layer 64 may also comprise a gradient layer with a content of an element (e.g., germanium) that varies along the depth of the epitaxial layer 64. Deposition methods for depositing the epitaxial layer 64 include chemical vapor deposition (CVD), low pressure CVD (LPCVD), atomic layer CVD (ALCVD), ultrahigh vacuum CVD (UHVCVD), remote plasma CVD (RPCVD), vapor-phase epitaxy (VPE), molecular beam epitaxy (MBE), any other suitable deposition processes, or any combination thereof.

Figure 3C:
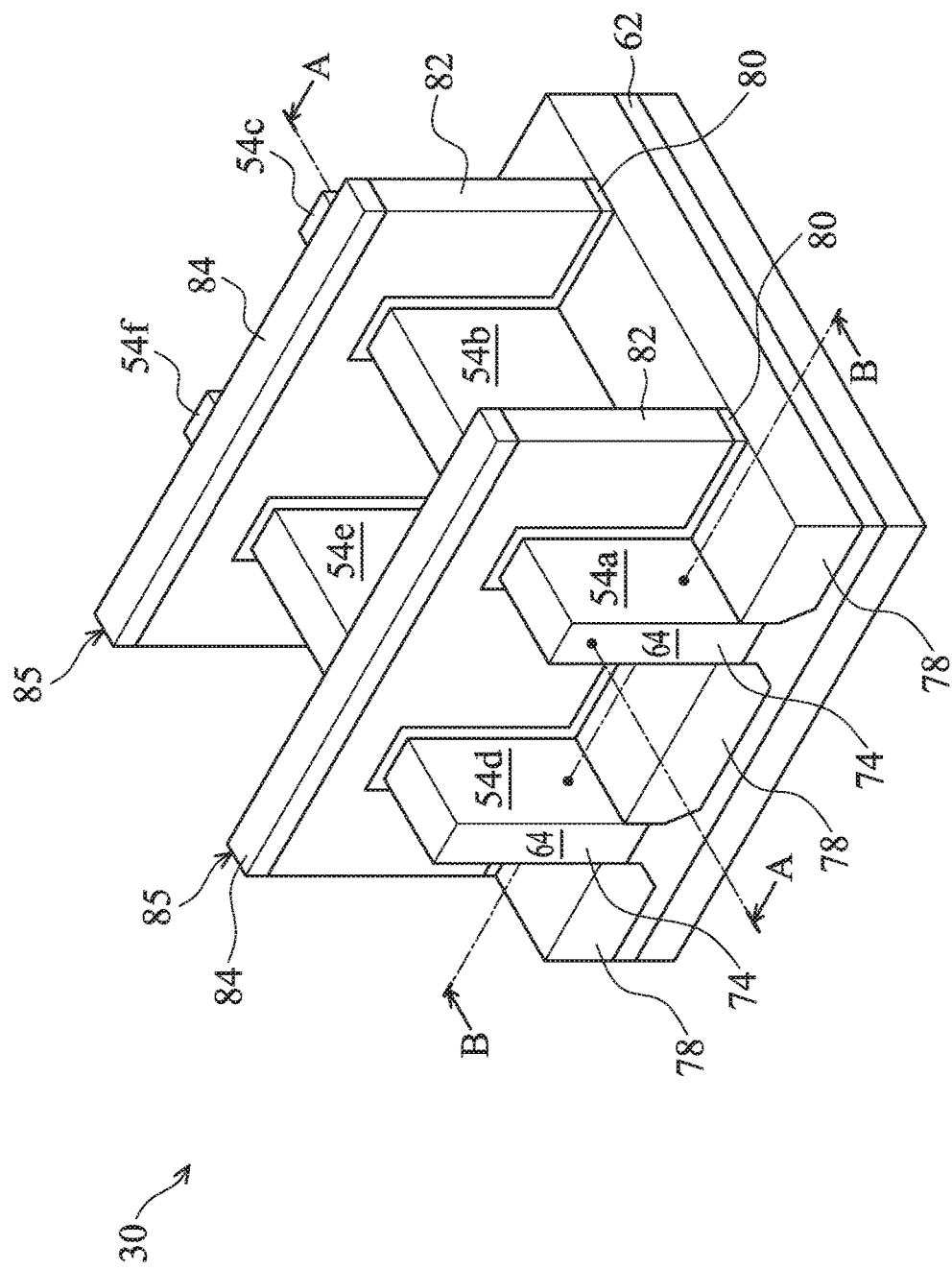

As shown in FIGS. 3A through 3C and at operation 12 of the method 10, fins 74 are formed in the epitaxial layer 64 and the semiconductor substrate 60, such as n-well 62. The fins 74 can be formed by etching trenches through the epitaxial layer 64 into the semiconductor substrate 60, such as into the n-well 62, using appropriate photolithography and etching processes, for example. Isolation regions 78 are formed, each in a corresponding trench. The isolation regions 78 may include or be an insulating material such as an oxide (such as silicon oxide), a nitride, the like, or a combination thereof. The insulating material may be deposited by any acceptable deposition process and recessed using an acceptable etch process to form the isolation regions 78. The fins 74 protrude from between neighboring isolation regions 78, which may, at least in part, thereby delineate the fins 74 as active areas on the semiconductor substrate 60.

In some embodiments, instead of forming the fins 74 from the epitaxial layer 64, the fins 74 can be formed by etching the trenches into the semiconductor substrate 60, similar to what was described previously. Hence, the fins 74 can be the same material as the semiconductor substrate. In certain embodiments, the semiconductor substrate 60 is a silicon wafer, and the fins 74 are also silicon. Fins 74 are generally depicted in some of the subsequent figures, which can include or omit the epitaxial layer 64.

A person having ordinary skill in the art will readily understand that the process described above is just an example of how fins 74 may be formed. In other embodiments, a dielectric layer can be formed over a top surface of the semiconductor substrate 60; trenches can be etched through the dielectric layer; epitaxial structures (e.g., homoepitaxial or heteroepitaxial structures) can be epitaxially grown in the trenches; and the dielectric layer can be recessed such that the epitaxial structures protrude from the dielectric layer to form fins. Fins formed by these processes can have a general structure similar to what is shown in the figures.

As shown in FIGS. 3A through 3C and at operation 14 of the method 10, dummy gate structures 85 are formed over the fins 74. The dummy gate structures 85 are over and extend laterally perpendicularly to the fins 74. Each dummy gate structure 85 comprises a dielectric layer 80, a dummy gate layer 82, and a mask 84. The dielectric layer 80, dummy gate layer 82, and mask 84 for the dummy gate structures 85 may be formed by sequentially forming respective layers, such as by appropriate deposition processes, and then patterning those layers into the dummy gate structures 85, such as by appropriate photolithography and etching processes. For example, the dielectric layer 80 may include or be silicon oxide, silicon nitride, the like, or multilayers thereof. The dummy gate layer 82 may include or be silicon (e.g., polysilicon) or another material. The mask 84 may include or be silicon nitride, silicon oxynitride, silicon carbon nitride, the like, or a combination thereof.

FIG. 3C illustrates the intermediate structure in a three-dimensional view after the dummy gate structures 85 are formed. Fins 74 are formed on the semiconductor substrate 60, and the fins 74 each protrude above and from between neighboring isolation regions 78. In each dummy gate structure 85, the dielectric layer 80 is along sidewalls and over top surfaces of the fins 74; the dummy gate layer 82 is over the dielectric layer 80; and the mask 84 is over the dummy gate layer 82. Source/drain regions 54a-f are disposed in respective regions of the fins 74 on various opposing sides of a respective dummy gate structure 85.

FIG. 3C further illustrates reference cross-sections that are used in figures. Cross-section A-A is in a plane along, e.g., channels in a fin 74 between opposing source/drain regions 54a-c. Cross-section B-B is in a plane perpendicular to cross-section A-A and is across source/drain region 54a and source/drain region 54d in neighboring fins 74. Figures ending with an "A" designation illustrate cross-sectional views at various instances of processing corresponding to cross-section A-A, and figures ending with a "B" designation illustrate cross-sectional views at various instances of processing corresponding to cross-section B-B. In some figures, some reference numbers of components or features illustrated therein may be omitted to avoid obscuring other components or features; this is for ease of depicting the figures.

In some embodiments, after forming the dummy gate structures 85, lightly doped drain (LDD) regions (not specifically illustrated) may be formed in the fins 74. For example, dopants may be implanted into the fins 74 using the dummy gate structures 85 as masks. Example dopants for the LDD regions can include or be, for example, boron for a p-type device and phosphorus or arsenic for an n-type device, although other dopants may be used. The LDD regions may have a dopant concentration in a range from about $10^{15}$ cm$^{-3}$ to about $10^{17}$ cm$^{-3}$.

Figure 4B:
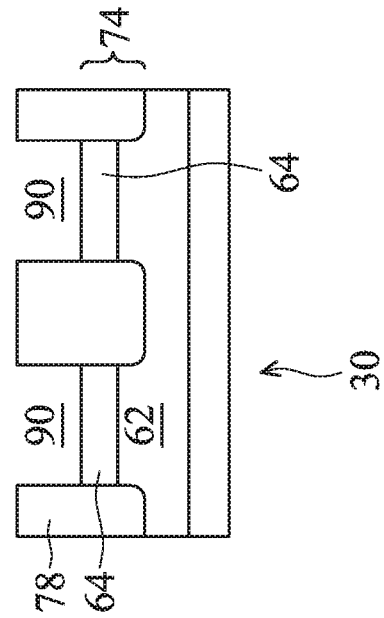
Figure 4A:
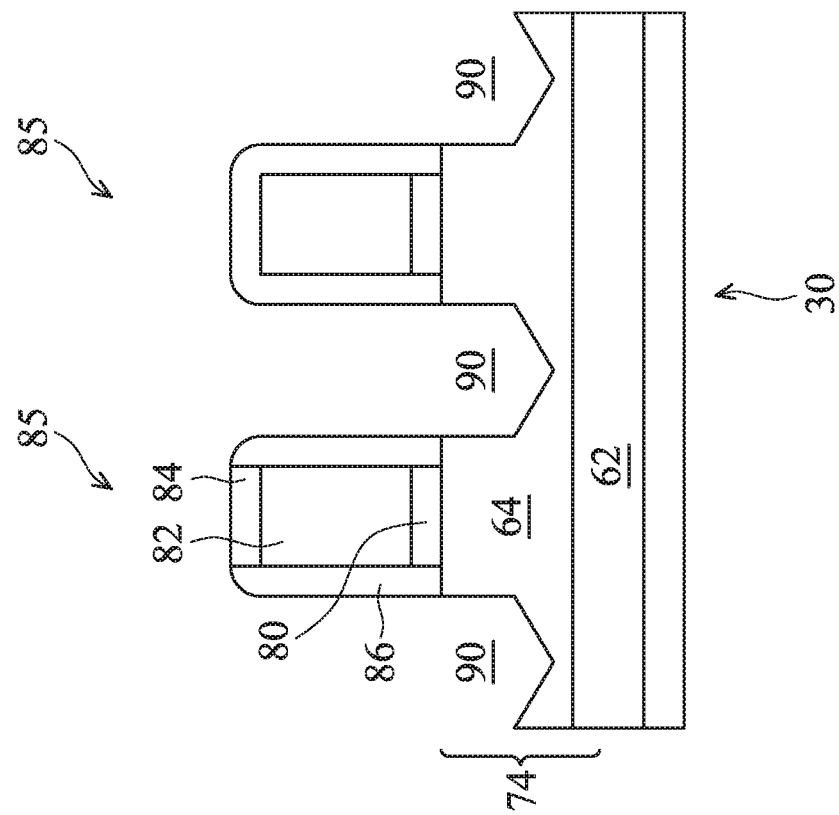

As shown in FIGS. 4A and 4B, gate spacers 86 are formed along sidewalls of the dummy gate structures 85 (e.g., sidewalls of the dielectric layer 80, the dummy gate layer 82, and the mask 84) and over the fins 74. The gate spacers 86 may be formed by conformally depositing one or more layers for the gate spacers 86, such as by an appropriate deposition process, and aniostropically etching, such as by an appropriate etching process, the one or more layers to form the gate spacers 86. The gate spacers 86 may include or be silicon nitride, silicon oxynitride, silicon carbon nitride, the like, multi-layers thereof, or a combination thereof.

As shown further in FIGS. 4A and 4B and at operation 16 of the method 10, recesses 90 are formed in the fins 74. As illustrated, the recesses 90 are formed in the fins 74 on opposing sides of the dummy gate structures 85. The recesses 90 can be formed by an etch process. The etch process can be isotropic or anisotropic, or, further, may be selective with respect to one or more crystalline planes of the semiconductor substrate 60 and/or the epitaxial layer 64. Hence, the recesses 90 can have various cross-sectional profiles based on the etch process implemented. The etch process may be a dry etch, such as a plasma etch using a processing gas, including but not limited to, tetrafluoromethane ($CF_4$), chlorine gas ($Cl_2$), nitrogen trifluoride ($NF_3$), sulfur hexafluoride ($SF_6$).

Figures 5A, 5B:
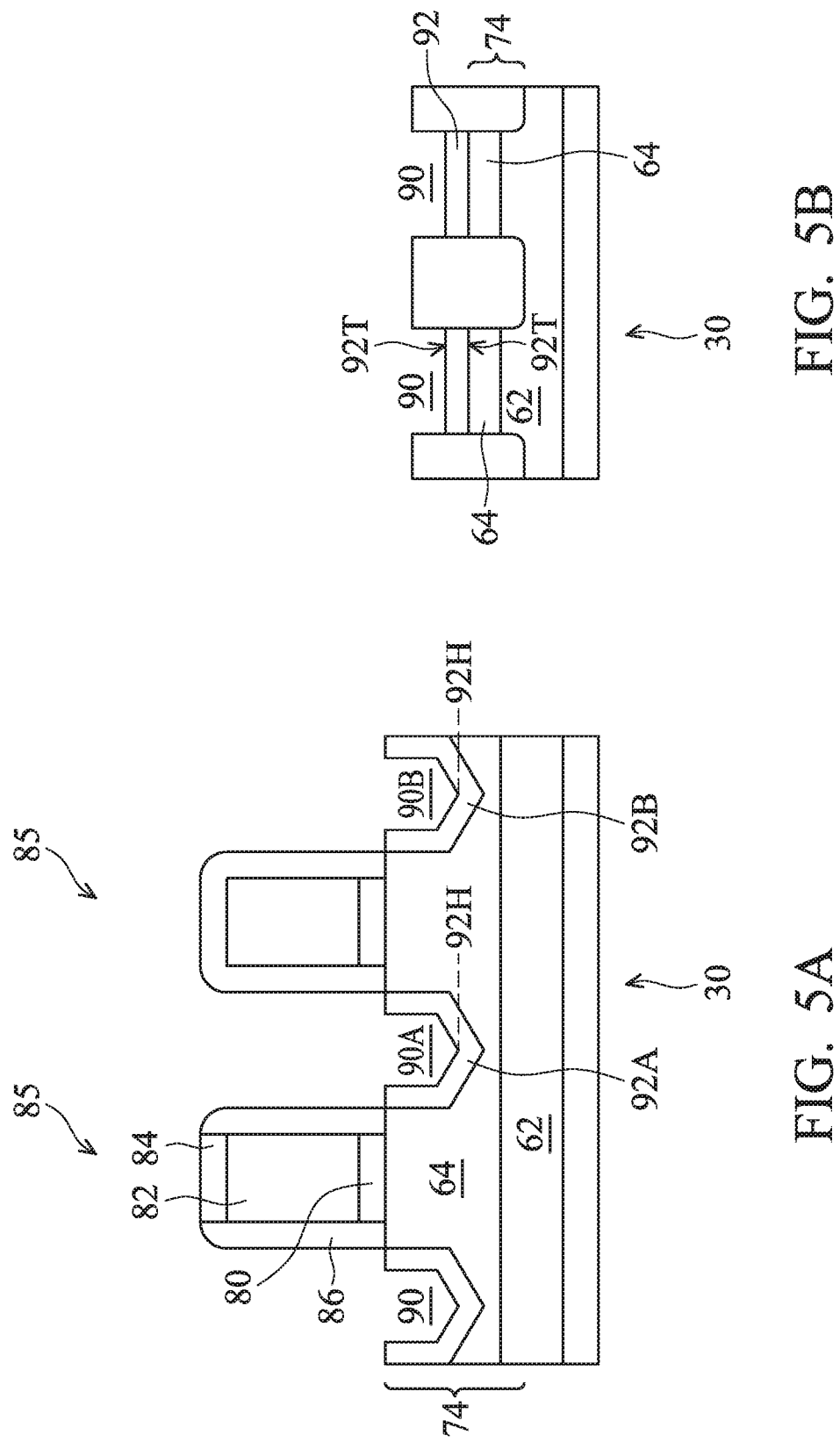

As shown in FIGS. 5A and 5B and at operation 18 of the method 10, interfacial layers 92 are formed over surfaces of the respective recesses 90 in the fins 74. The interfacial layer 92 may include or be silicon germanium ($Si_xGe_{1-x}$, where x can be between approximately 0 and 1). In certain embodiments, interfacial layer 92 comprises SiGe with a Si atomic percent content of about 90% or more (e.g., in a range from about 90% to about 99.9%) and a Ge atomic percent content of about 10% or less (e.g., in a range from about 0.1% to about 10%). In certain embodiments, the interfacial layer 92 is deposited to a thickness 92T in a range from about 1 nm to about 10 nm. In certain embodiment, the interfacial layer 92 is deposited to a thickness 92T in a range from about 1 nm to about 4 nm. In certain embodiments, a first interfacial layer 92A is formed over a first portion (e.g., in a first recess 90A) of the fin 74; and a second interfacial layer 92B is formed over a second portion (e.g., in a second recess 90B) of the fin 74. The first interfacial layer 92A and the second interfacial layer 92B are formed to a height 92H. The term height 92H of the interfacial layer 92 is defined as the lowest point of the top surface of the interfacial layer 92 in the recess 90 of the fin 74. In certain embodiments, the variation of the height 92H of the first interfacial layer 92A and the height 92H of the second interfacial layer 92B is about 5 nm or less, such as in a range from greater than 0 nm to about 5 nm.

The interfacial layer 92 may be formed in the recesses 90 by epitaxially growing a material in the recesses 90, such as by LPCVD, RPCVD, metal-organic CVD (MOCVD), MBE, liquid phase epitaxy (LPE), VPE, selective epitaxial growth (SEG), the like, or a combination thereof.

One example of a growth process for a SiGe interfacial layer includes performing an epitaxial growth process at a temperature in a range from about 500° C. to about 800° C. The epitaxial growth process may be performed at a pressure in a range from about 1 Torr to about 100 Torr. Processing gases may include HCl, $SiH_4$ (silane), $SiH_2Cl_2$ (dichlorosilane), $GeH_4$ (germane), $H_2$, or $N_2$, carrier gas, other silicon precursors, other germanium precursors, other etching gases, other carrier gases, and combinations thereof.

In certain embodiments, the interfacial layer 92 may help to suppress the effects of surface impurities formed over or in the fin 74 during various stages of manufacturing the semiconductor structure 30. The interfacial layer 92 can help to cover impurities and can help prevent impurities from entering underlying layers or from diffusing out of underlying layers. For example, the impurities may be chlorine, oxygen, carbon, fluorine, and/or silicon species resulting and remaining from the etch process at operation 16 in the formation of recesses 90 of the fins 74. For example, the halogen impurities may come from the etching gases used in a dry etch process, such as $CF_4$, $Cl_2$, $NF_3$, $SF_6$ etching gas. The silicon impurities may come from the silicon from the epitaxial layer 64 comprising SiGe or comprising Si. The oxygen impurities may come from partial etching of the isolation region 78 comprising silicon oxide. The carbon impurities may come from carbon residual materials remaining from photoresist or other layers of the semiconductor structure 30.

Not wishing to be bound by any theory unless specifically set forth in the claims, the interfacial layer 92 comprising a high amount of silicon, such as a Si atomic percent content of about 90% or more (e.g., in a range from about 90% to about 99.9%), may help to suppress the effects of surface impurities and reduce roughness. In certain aspects, the high amount of a silicon precursor, such as silane ($SiH_4$), during the formation of the interfacial layer 92 may help to volatilize or to remove the impurities. In certain aspects, the high amount of a silicon precursor, such as silane ($SiH_4$), during the formation of the interfacial layer 92 may help cover or encapsulate the impurities within the interfacial layer 92. The interfacial layer 92 may help to act as a getter so that impurities reside in the interfacial layer 92 rather than in the source/drain region. Impurities in the source/drain region may disrupt the epitaxial growth and causes non-uniform growth of the source/drain region. If the thickness of the interfacial layer 92 is less than 1 nm, surface impurities may still remain on the fin 74 or may not be fully covered by the interfacial layer 92. If the thickness of the interfacial layer 92 is greater than 5 nm, the growth of epitaxial layers thereover to form the source/drain regions may lead to undesirable lattice dislocations in the epitaxial source/drain regions formed thereover. Lattice dislocations in the epitaxial source regions may result in an undesirable lower strain transfer to the channel of strain channel devices and may lower device performance.

In certain embodiments, the interfacial layer 92 may help to lower the surface roughness of the recesses 90 of the fin 74. The surface roughness of the recesses 90 of the fin 74 may be over about 2.5 nm RMS. In certain embodiments, the interfacial layer 92 has a surface roughness of about 2 nm RMS or less, such as in a range from about 0.1 nm RMS to about 2 nm RMS. In certain embodiments, a smooth interfacial layer 92 may help to provide uniform epitaxial growth of an epitaxial source/drain region thereover. In certain embodiments, a smooth interfacial layer 92 may help to provide reduced crystal dislocations in an epitaxially grown source/drain region resulting in increased conductivity of the epitaxial source/drain region and/or increased adhesion of the epitaxial source/drain region. In certain embodiments, a smooth interfacial layer 92 may help to provide reduced crystal dislocations in an epitaxial source/drain region resulting in increased strain characteristics of the channel formed by the fin 74 below the dummy gate structures 85. For example, an epitaxial source/drain region, such as a silicon germanium source/drain region, may induce strain in the channel to increase the semiconductor device performance. In certain embodiments, a smooth interfacial layer 92 may help to provide uniform lateral and uniform vertical growth of an epitaxial source/drain region so that the shape of the epitaxial source/drain region may be controlled. In certain embodiments, a smooth interfacial layer 92 may help to provide uniform growth of an epitaxial source/drain region to a uniform size and shape. A uniform size and shape of an epitaxial source/drain region helps to provide consistent formation of many contacts to the respective epitaxial source/drain regions.

As shown in FIGS. 6A and 6B and at operation 20 of the method 10, an epitaxial source/drain region 94 is formed over the interfacial layer 92. The epitaxial source/drain region 94 may include or be silicon germanium ($Si_xGe_{1-x}$, where x can be in a range from 0 to 1), silicon carbide, silicon phosphorus, silicon carbon phosphorus, germanium, a III-V compound semiconductor, a II-VI compound semiconductor, or the like.

In certain embodiments, the epitaxial source/drain region 94 comprise SiGe, the interfacial layer 92 comprises SiGe, and the fin 74 (e.g., epitaxial layer 64) comprises SiGe. In certain embodiments, the epitaxial source/drain region 94 comprises SiGe with an atomic percent content of germanium of about 25% or more (e.g., in a range from about 25% to about 70%); the interfacial layer 92 comprises SiGe with an atomic percent content of silicon of about 90% or more (e.g., in a range from about 90% to about 99.9%); and the fin 74 (e.g., epitaxial layer 64) comprises SiGe with an atomic percent content of germanium of about 5% or more (e.g., in a range from about 5% to about 40%). In certain embodiments, the SiGe source/drain 94 has a germanium atomic percent content of about 20% or more greater than the germanium atomic percent content of the SiGe fin 74.

In some examples, the epitaxial source/drain regions 94 may also be doped, such as by in situ doping during epitaxial growth and/or by implanting dopants into the epitaxial source/drain region 94 after epitaxial growth. Example dopants for the epitaxial source/drain region 94 can include or be, for example, boron for a p-type device and phosphorus or arsenic for an n-type device, although other dopants may be used. The epitaxial source/drain region 94 (or other source/drain region) may have a dopant concentration in a range from about $10^{19}$ cm$^{-3}$ to about $10^{21}$ cm$^{-3}$. A source/drain region may be delineated by doping (e.g., by implantation and/or in situ during epitaxial growth, if appropriate) and/or by epitaxial growth, if appropriate, which may further delineate the active area in which the source/drain region is delineated.

In certain embodiments, the epitaxial source/drain region 94 may comprise multiple layers. In certain examples, the epitaxial source/drain region 94 comprises a first layer (L1), a second layer (L2), and a third layer (L3). In certain embodiments, the epitaxial source/drain region comprises a first layer of SiGe, a second layer of SiGe, and a third layer of SiGe, in which each of the layers have a different germanium atomic percent content and/or a different dopant concentration. In certain embodiments, the epitaxial source/drain region 94 comprises a first layer of SiGe, a second layer of SiGe, and a third layer of a capping material. The capping material may be or comprise Si or other suitable materials. In certain embodiments, the capping material can help protect the underlying SiGe from environmental effects, such as oxidation and humidity. The capping layer may also be used to form better ohmic contact with a metal used to make electrical contact with the epitaxial source/drain region 94. In certain embodiments, the capping material can help to protect the underlying SiGe from outgassing germanium.

Although the epitaxial source/drain region 94 is illustrated as three layers, the epitaxial source/drain region 94 is not limited to such layers. In other embodiments, the epitaxial source/drain region 94 may comprise one layer, two layers, or more layers. In other embodiments, the epitaxial source/drain region 94 may comprise additional layers (e.g., additional intermediate layer(s), additional outer layer(s)).

As shown in FIG. 6B, two epitaxial source/drain regions 94 are formed as a merged source/drain region. In other embodiments, the epitaxial source/drain region 94 may be formed as an unmerged doped source/drain region. The growth of the epitaxial source/drain region 94 may be other shapes depending on the bottom surface of the recess 90 and/or depending on a lateral and a vertical growth of the epitaxial growth of the epitaxial source/drain region 94 over the interfacial layer 92.

The epitaxial source/drain region 94 may be formed over the interfacial layer 92 by epitaxially growing a material in the recesses 90, such as by LPCVD, RPCVD, MOCVD, MBE, LPE, VPE, SEG, the like, or a combination thereof. As illustrated in FIGS. 6A and 6B, due to blocking by the isolation regions 78, the epitaxial source/drain region 94 is first grown vertically in the recess 90, during which time the epitaxial source/drain region 94 may not grow horizontally. After the recess 90 is fully filled, the epitaxial source/drain region 94 may grow both vertically and horizontally to form facets, which may correspond to crystalline planes of the semiconductor substrate 60. In some examples, different materials are used for epitaxial source/drain regions for p-type devices and n-type devices. Appropriate masking during the recessing or epitaxial growth may permit different materials to be used in different devices.

In certain embodiments, the interfacial layers 92A and 92B may be formed to a height 92H with a variation of about 5 nm or less. The height 92H with a variation of about 5 nm or less helps epitaxially growth of the source/drain regions 94A and 94B over the interfacial layer 92 to a height 94H having a variation in a range from about 0 nm to about 10 nm. For example, the height 94H of a first source/drain region 94A formed over the first interfacial layer 92A and the height 94H of a second source/drain region 94B formed over the second interfacial layer 92B are substantially uniform. The term height 94H of the source/drain region 94 is defined as the highest point of the top surface of the source/drain 94.

Figure 6C:
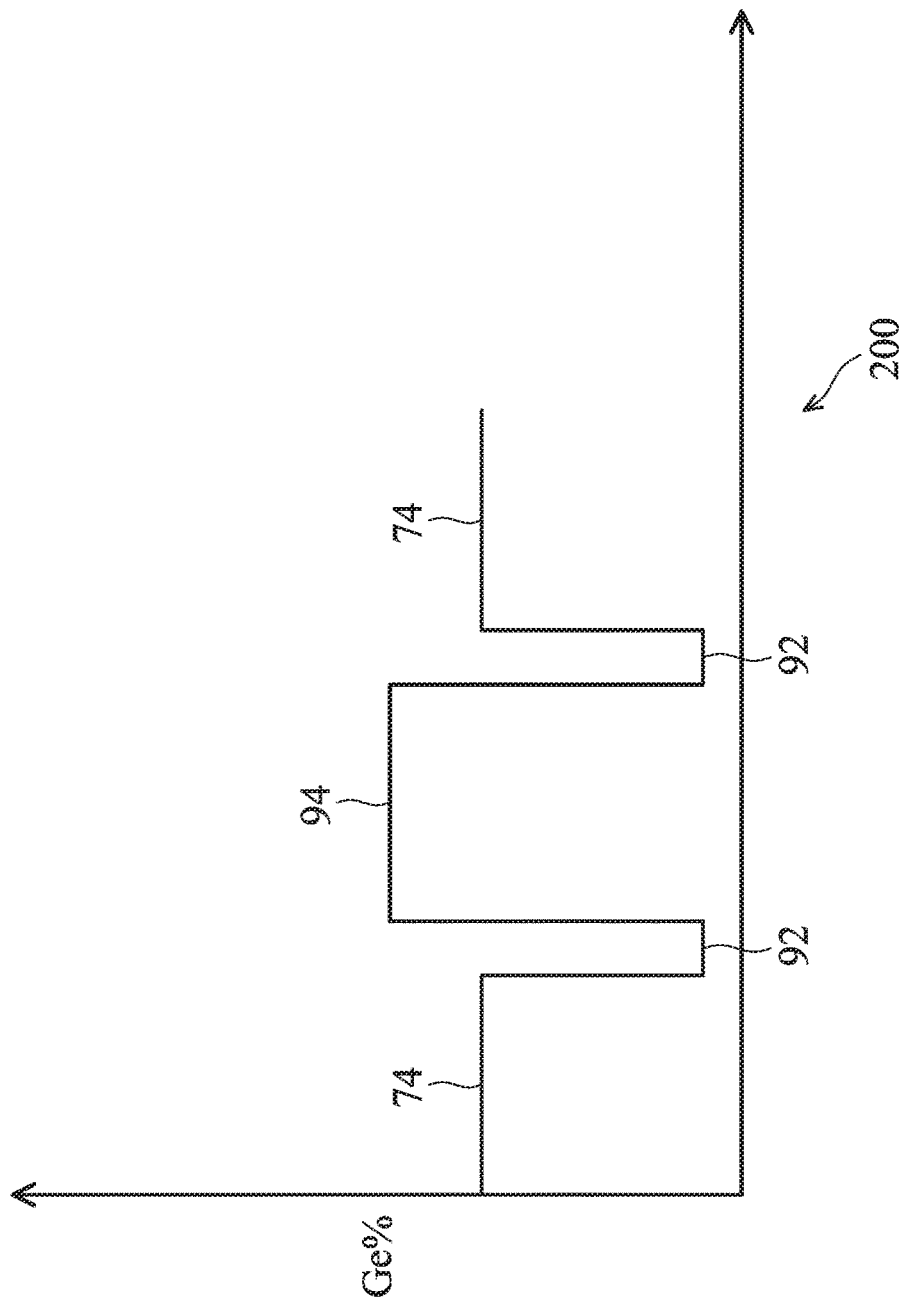

FIG. 6C is a graph 200 of the atomic percent content of germanium across the fin 74, the interfacial layer 92, the source/drain region 94, and back through the interfacial layer 92, and the fin 74 in a direction 98 (as shown in FIG. 6A), in accordance with some embodiments. The germanium atomic percent content of the interfacial layer 92 is lower than the germanium atomic percent content of the fin 74 and the source/drain region 94 adjacent to the interfacial layer 92. The germanium atomic percent content of the source/drain region 94 is higher than the fin 74 adjoined by the interfacial layer 92.

FIG. 6D is a graph 300 of the atomic percent content of germanium through the third layer L3, the second layer L2, and the first layer L1 of the source/drain region 94, through the interfacial layer 92, and into fin 74 in a direction 99 (as shown in FIG. 6A), in accordance to some embodiments. The germanium atomic percent content of the interfacial layer 92 is lower than the germanium atomic percent content of the first layer L1 of the source/drain region 94 and the fin 74 adjacent to the interfacial layer 92. The germanium atomic percent content of the first layer L1 of the source/drain region 94 is higher than the fin 74 adjoined by the interfacial layer 92. The germanium atomic percent content of the third layer L3 of the source/drain region 94 is lower than the second layer L2 of the source/drain region 94 but higher than the first layer L1 of the source/drain region 94.

Figure 7A:
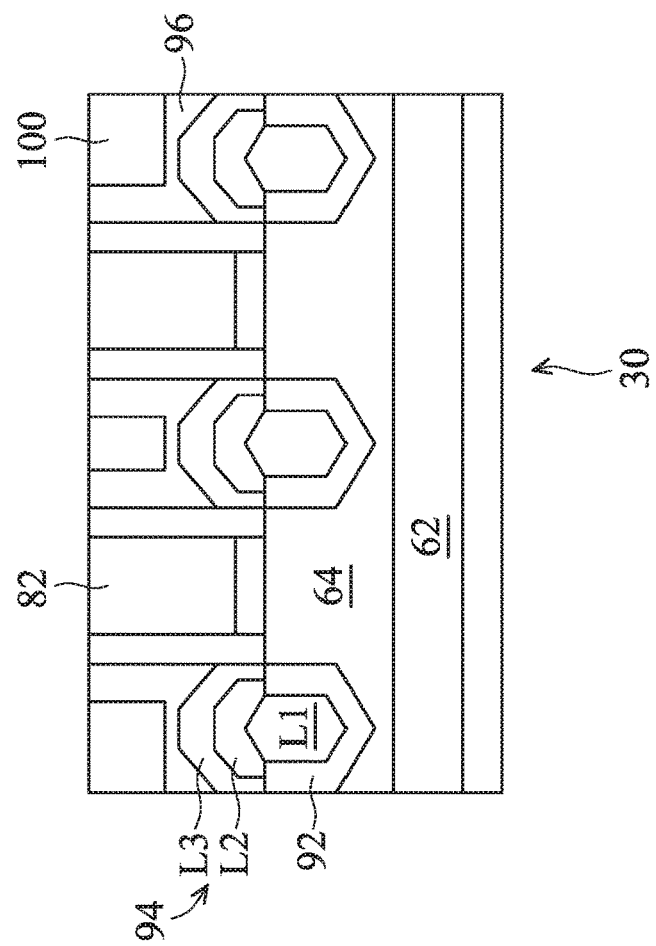
Figure 7B:
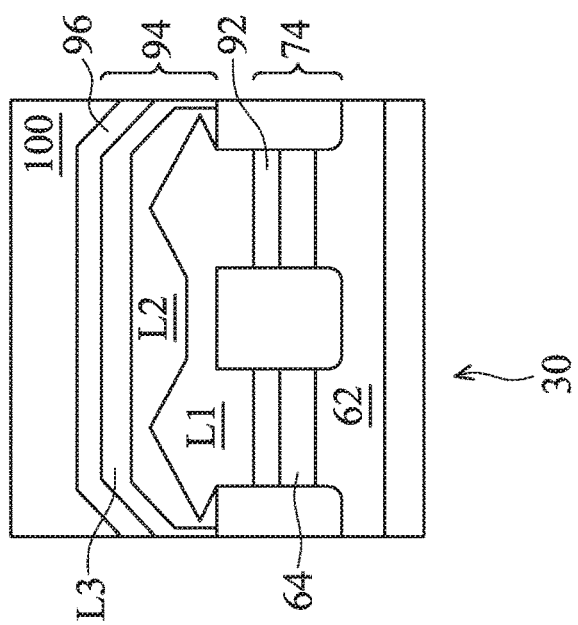

FIGS. 7A and 7B illustrate the formation of a contact etch stop layer (CESL) 96 and a first interlayer dielectric (ILD) 100 over the CESL 96. Generally, an etch stop layer can provide a mechanism to stop an etch process when forming, e.g., contacts or vias. An etch stop layer may be formed of a dielectric material having a different etch selectivity from adjacent layers or components. The CESL 96 is deposited, such as by an appropriate deposition process, on surfaces of the epitaxial source/drain regions 94, sidewalls and top surfaces of the gate spacers 86, top surfaces of the mask 84, and top surfaces of the isolation regions 78. The CESL 96 may comprise or be silicon nitride, silicon carbon nitride, silicon carbon oxide, carbon nitride, the like, or a combination thereof. The first ILD 100 may comprise or be silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OS G), $SiO_xC_y$, Spin-On-Glass, Spin-On-Polymers, silicon carbon material, a compound thereof, a composite thereof, the like, or a combination thereof. The first ILD 100 may be planarized after being deposited, such as by a CMP, which may remove the masks 84 from the dummy gate structures 85 and expose the dummy gate layers 82.

FIGS. 8A and 8B illustrate an intermediate structure after replacing the dummy gate structures 85 with respective replacement gate structures, forming a second ILD 130, and forming contacts 146A, 146B, 146C. The dummy gate structures 85 are removed, such as by an appropriate etching process, to form trenches. The trenches are filled with respective replacement gate structures. The replacement gate structures each include a conformal gate dielectric layer 112, an optional metal liner layer 114, and a conductive gate fill 116. The conformal gate dielectric layer 112, optional metal liner layer 114, and conductive gate fill 116 can be deposited by appropriate deposition techniques.

The gate dielectric layer 112 is formed conformally in the trench, such as along sidewall and top surfaces of the fin 74 and along sidewalls of the gate spacers 86. The gate dielectric layer 112 may be a silicon oxide, silicon nitride, a high-k dielectric material, or multilayers thereof. A high-k dielectric material, such as a dielectric having a k value greater than about 7.0, may include or be a metal oxide or a silicate of Hf, Al, Zr, La, Mg, Ti, Y, Sc, Lu, Gd, Sr, Dy, Ca, Sm, or a combination thereof.

One or a plurality of metal liner layers 114 can be formed conformally over the gate dielectric layer 112. The metal liner layers 114 can include a capping layer, a barrier layer, and/or a work function tuning layer. A capping layer and a barrier layer can be used to prevent impurities from diffusing into or away from underlying layers. The capping layer and/or barrier layer may include tantalum nitride, titanium nitride, the like, or combinations thereof. A work function tuning layer can be chosen to tune the work function value so that a desired threshold voltage Vt is achieved in the transistor that is formed. Examples of a work function tuning layer include TaAl, TaN, TaAlC, TaC, TaCN, TaSiN, Ti, TiN, TiAlN, Ag, Mn, Zr, Ru, Mo, Al, WN, $ZrSi_2$, $MoSi_2$, $TaSi_2$, $NiSi_2$, other suitable work function materials, or a combination thereof.

A conductive gate fill 116 is formed over the optional metal liner layer 114 (if implemented) and/or the gate dielectric layer 112 and fills the trench. The conductive gate fill 116 may comprise a metal-containing material such as tungsten (W), cobalt (Co), ruthenium (Ru), aluminum (Al), titanium nitride (TiN), tantalum nitride (TaN), tantalum carbon (TaC), titanium aluminum nitride (AlTiN), titanium aluminum carbon (AlTiC), titanium aluminum oxide (AlTiO), a combination thereof, multi-layers thereof, and other suitable conductive materials.

Portions of the layers for the conductive gate fill 116, the optional metal liner layer 114, and the gate dielectric layer 112 above the top surfaces of the first ILD 100, the CESL 96, and the gate spacers 86 are removed, such as by a planarization process, like a CMP process.

The second ILD 130 is formed over the first ILD 100, the replacement gate structures, the gate spacers 86, and the CESL 96. Although not illustrated, in some examples, an etch stop layer may be deposited over the first ILD 100, etc., and the second ILD 130 may be deposited over the ESL. The second ILD 130 may comprise or be silicon dioxide, a low-k dielectric material, silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof. The second ILD 130 may be deposited by any acceptable deposition technique.

Openings through the second ILD 130, the first ILD 100, and the CESL 96 to the epitaxial source/drain regions 94 are formed to expose at least portions of the epitaxial source/drain regions 94, such as by using appropriate photolithography and one or more etch processes. Contacts 146 are formed in the openings to the epitaxial source/drain regions 94. The contacts 146 may include a fill metal, such as tungsten, aluminum, cobalt, ruthenium, copper, or other suitable metals. The contacts 146 may further include silicide on the respective epitaxial source/drain regions 94 and a barrier and/or adhesion layer between the fill metal and sidewalls of the openings.

It is understood that the semiconductor devices and methods of manufacture may also include additional layers, such as photoresist layers, mask layers, diffusion barrier layers, capping layers, silicide areas, etch stop layers, dielectric layers, adhesion layers, and the other suitable layers. It is understood that the substrate may include a plurality of features (doped regions or wells, fins, source/drain regions, isolation regions, shallow trench isolation (STI) feature, gate structures, interconnect lines, vias, and other suitable features) formed in, on, and/or over the substrate. The plurality of layers and/or features is used in the fabrication of semiconductor devices and integrated circuits. The substrate may also include additional materials formed in, on, and/or over the substrate in the operations of the methods and in the figures as described herein. The semiconductor devices and methods may also include additional manufacturing processes including photoresist coating (e.g., spin-on coating), soft baking, mask aligning, exposure, post-exposure baking, developing the photoresist, rinsing, drying, hard baking, inspection, etching, planarization, chemical mechanical polishing (CMP), wet clean, ashing, and/or other applicable processes. While the source/drain regions discussed herein are fabricated using recessed fins, source/drain regions may be fabricated by forming source/drain regions over non-recessed fins.

In certain embodiments, a p-type FinFET in a FinFET device is formed over an n-well and/or with p-type/p-doped epitaxial source/drain regions. It is understood that the p-type FinFET devices may also be integrated with the formation of n-type FinFET devices.

Embodiments disclosed herein relate generally to forming an interfacial layer, such as an interfacial layer comprising SiGe along surfaces of a recess in a fin between an epitaxial source/drain region and the fin of a FinFET device. In certain embodiments, the interfacial layer may suppress the effects of surface impurities formed during the manufacturing stages of a FinFET device. In certain embodiments, the interfacial layer may enhance uniform growth of the epitaxial source/drain region in the respective recesses of a fin of a FinFET device. In certain embodiments, the epitaxial source/drain region comprises p-doped SiGe to induce strain in a channel defined by a gate structure over the fin.

An embodiment is a semiconductor structure. The semiconductor structure includes a substrate. A fin is on the substrate. The fin includes silicon germanium. An interfacial layer is over the fin. The interfacial layer has a thickness in a range from about 1 nm to about 4 nm. A source/drain region is over the interfacial layer. The source/drain region includes silicon germanium.

An embodiment is a method of manufacturing a semiconductor device. The method includes forming a fin on a substrate. A gate structure is formed over the fin. A recess is formed in the fin proximate the gate structure. An interfacial layer is formed in the recess. The interfacial layer includes silicon germanium. A source/drain region is formed over the interfacial layer by epitaxial growth.

An embodiment is another semiconductor structure. The semiconductor structure includes a substrate. A fin is on the substrate. A first interfacial layer is over a first portion of the fin. A second interfacial layer is over a second portion of the fin. The first interfacial layer and the second interfacial layer have a height variation within 5 nm. A first source/drain region is on the first interfacial layer. A second source/drain region is on the second interfacial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   a substrate;
   a fin on the substrate, the fin comprising silicon germanium and having recessed portions;
   an interfacial layer over the recessed portions of the fin, the interfacial layer having a thickness in a range from about 1 nm to about 4 nm, wherein the interfacial layer encapsulates impurities on a surface of the fin; and
   a source/drain region over the interfacial layer, the source/drain region comprising silicon germanium.

2. The semiconductor structure of claim 1, wherein the fin has a germanium atomic percent content in a range from about 5% to about 40%.

3. The semiconductor structure of claim 1, wherein the source/drain region comprises a germanium atomic percent content in a range from about 25% to about 70%.

4. The semiconductor structure of claim 1, wherein the source/drain region comprise a p-type dopant.

5. The semiconductor structure of claim 1, wherein the interfacial layer has a surface roughness in a range from about 2 nm RMS or less RMS.

6. The semiconductor structure of claim 1, wherein the interfacial layer comprises silicon germanium.

7. The semiconductor structure of claim 6, wherein the interfacial layer has a silicon atomic percent content in a range from about 90% to about 99.9%.

8. The semiconductor structure of claim 1, wherein the interfacial layer comprises silicon germanium, the interfacial layer having a higher silicon atomic percent content than the source/drain region and the fin.

9. A method of manufacturing a semiconductor device, the method comprising:
   forming a fin on a substrate;
   forming a gate structure over the fin;
   forming a recess in the fin proximate the gate structure;
   forming an interfacial layer in the recess, the interfacial layer comprising silicon germanium, wherein the interfacial layer has a silicon atomic percent content of about 90% or more; and
   growing an epitaxial source/drain region over the interfacial layer by epitaxial growth.

10. The method of claim 9, wherein the interfacial layer is formed by providing a silicon precursor.

11. The method of claim 10, wherein the silicon precursor comprises silane.

12. The method of claim 10, wherein silane volatilizes impurities from a surface of the fin.

13. The method of claim 9, wherein the interfacial layer provides a surface roughness less than about 2 nm RMS for the growing of the epitaxial source/drain region.

14. The method of claim 9, wherein the interfacial layer encapsulates impurities on a surface of the fin.

15. The method of claim 9, wherein the interfacial layer comprises silicon germanium, the interfacial layer having a higher silicon atomic percent content than the epitaxial source/drain region and the fin.

16. A semiconductor structure comprising:
   a substrate;
   a fin on the substrate, wherein the fin comprises silicon germanium;
   a first interfacial layer over a first portion of the fin, wherein the first interfacial layer comprises silicon germanium;
   a second interfacial layer over a second portion of the fin, wherein the second interfacial layer comprises silicon germanium, wherein the first interfacial layer and the second interfacial layer have a height variation within 5 nm;
   a first source/drain region on the first interfacial layer, wherein the first source/drain region comprises silicon germanium, the silicon germanium of the first interfacial layer having a higher silicon atomic percent content than the silicon germanium of the fin and the silicon germanium of the first source/drain region; and
   a second source/drain region on the second interfacial layer, wherein the second source/drain region comprises silicon germanium, the silicon germanium of the second interfacial layer having a higher silicon atomic percent content than the silicon germanium of the fin and the silicon germanium of the second source/drain region.

17. The semiconductor structure of claim 16, wherein the first interfacial layer and the second interfacial layer each have a thickness in a range from about 1 nm to about 4 nm.

18. The semiconductor structure of claim 16, wherein the first interfacial layer and the second interfacial layer each have a silicon atomic percent content in a range from about 90% to about 99.9%.

19. The semiconductor structure of claim 16, wherein the fin has a germanium atomic percent content in a range from about 5% to about 40%.

20. The semiconductor structure of claim 16, wherein the first source/drain region and the second source/drain region have a height variation of less than about 10 nm.

* * * * *